(12) United States Patent
Parthasarathy et al.

(10) Patent No.: US 12,175,191 B2
(45) Date of Patent: Dec. 24, 2024

(54) AUTOMATED TRANSLATION OF DESIGN SPECIFICATIONS OF ELECTRONIC CIRCUITS

(71) Applicant: Synopsys, Inc., Mountain View, CA (US)

(72) Inventors: Ganapathy Parthasarathy, Fremont, CA (US); Saurav Nanda, San Jose, CA (US); Parivesh Choudhary, Sunnyvale, CA (US); Pawan Patil, Sunnyvale, CA (US); Arun Venkatachar, Saratoga, CA (US)

(73) Assignee: Synopsys, Inc., Sunnyvale, CA (US)

( * ) Notice: Subject to any disclaimer, the term of this patent is extended or adjusted under 35 U.S.C. 154(b) by 333 days.

(21) Appl. No.: 17/526,687

(22) Filed: Nov. 15, 2021

(65) Prior Publication Data

US 2022/0171932 A1 Jun. 2, 2022

Related U.S. Application Data

(60) Provisional application No. 63/119,523, filed on Nov. 30, 2020.

(51) Int. Cl.
*G06F 40/284* (2020.01)
*G01R 31/317* (2006.01)
(Continued)

(52) U.S. Cl.
CPC ........ *G06F 40/284* (2020.01); *G06F 18/2431* (2023.01); *G06F 40/216* (2020.01);
(Continued)

(58) Field of Classification Search
CPC .... G06F 40/284; G06F 40/216; G06F 40/289; G06F 40/30; G06F 40/55; G06F 40/211;
(Continued)

(56) References Cited

U.S. PATENT DOCUMENTS 8,458,630 B1 * 6/2013 Van Canpenhout .. G06F 30/327
716/103
2010/0179804 A1 7/2010 Dargelas

OTHER PUBLICATIONS

Bowman et al ("A Fast Unified Model for Parsing and Sentence Understanding", hereinafter Bowman, Proceedings of the 54th Annual Meeting of the Association for Computational Linguistics, August, pp. 1-11 (Year: 2016).*
(Continued)

*Primary Examiner* — Leshui Zhang
(74) *Attorney, Agent, or Firm* — Fenwick & West LLP

(57) ABSTRACT

Embodiments relate to a system for translating design specifications of an electronic circuit. In one embodiment, the design specification is parsed to identify one or more sentences. From the one or more identified sentences, the system extracts semantic concepts. Additionally, for each sentence of the one or more identified sentences, the system determines whether the sentence is translatable. If a target sentence is translatable, the system generates a parse tree for the target sentence, and generates a probabilistic shift-reduce schedule for the generated parse tree. Using the generated probabilistic shift-reduce schedule and optionally the generated parse tree, the system generates code for verifying the condition specified in the target sentence. In some embodiments, to generate the code, the system parses the target sentence using the generated probabilistic shift-reduce schedule.

20 Claims, 9 Drawing Sheets

(51) Int. Cl.

| | |
|---|---|
| *G06F 8/41* | (2018.01) |
| *G06F 11/36* | (2006.01) |
| *G06F 18/214* | (2023.01) |
| *G06F 18/243* | (2023.01) |
| *G06F 18/2431* | (2023.01) |
| *G06F 30/327* | (2020.01) |
| *G06F 40/216* | (2020.01) |
| *G06F 40/289* | (2020.01) |
| *G06F 40/30* | (2020.01) |
| *G06F 40/55* | (2020.01) |
| *G06N 3/02* | (2006.01) |
| *G06N 3/045* | (2023.01) |
| *G06N 3/08* | (2023.01) |

(52) U.S. Cl.
CPC .......... *G06F 40/289* (2020.01); *G06F 40/30* (2020.01); *G06N 3/02* (2013.01)

(58) Field of Classification Search
CPC ........ G06F 40/44; G06F 40/35; G06F 40/205; G06F 40/253; G06F 40/56; G06F 40/268; G06F 40/20; G06F 40/45; G06F 18/2431; G06F 18/214; G06F 18/24323; G06F 18/243; G06F 16/24522; G06F 16/3344; G06F 16/3329; G06F 16/243; G06F 16/313; G06F 8/427; G06F 8/41; G06F 8/30; G06F 11/3608; G06F 11/36; G06F 30/327; G06F 17/2785; G06F 17/28; G06N 3/02; G06N 3/045; G06N 3/044; G06N 3/08; G06N 20/20; G01R 31/31704; G01R 31/317; G09B 5/04
USPC ....................................................... 704/1–9
See application file for complete search history.

(56) References Cited

OTHER PUBLICATIONS

Bowman, S. R. et al. "A Fast Unified Model for Parsing and Sentence Understanding." Proceedings of the 54th Annual Meeting of the Association for Computational Linguistics, Aug. 2016, pp. 1466-1477.

D'Ulizia, A. et al. "A Survey of Grammatical Inference Methods for Natural Language Learning." Artificial Intelligence Review, vol. 36, Jan. 6, 2011, pp. 1-27.

Fantechi, A. et al. "Assisting Requirement Formalization by Means of Natural Language Translation." Formal Methods in System Design, vol. 4, May 1994, pp. 243-263.

Granacki, J. J. et al. "Phran-Span: A Natural Language Interface for System Specifications." DAC '87: Proceedings of the 24th ACM/IEEE Design Automation Conference, Oct. 1987, pp. 416-422.

Granacki, J. J. et al. "Understanding System specifications Written in Natural Language." IJCAI '87: Proceedings of the 10th International Joint Conference on Artificial Intelligence, vol. 2, Aug. 1987, pp. 688-691.

Harris, C. B. et al. "GLAST: Learning Formal Grammars to Translate Natural Language Specifications into Hardware Assertions." 2016 Design, Automation & Test in Europe Conference & Exhibition (Date), Mar. 14-18, 2016, pp. 966-971.

Holt, A. et al. "A Semantically-Derived Subset of English for Hardware Verification." ACL '99: Proceedings of the 37th Annual Meeting of the Association for Computational Linguistics on Computational Linguistics, Jun. 1999, pp. 451-456.

Keszocze, O. et al. "Lips: An IDE for Model Driven Engineering Based on Natural Language Processing." 2013 1st International Workshop on Natural Language Analysis in Software Engineering (NaturaLiSE), May 25, 2013, pp. 31-38.

Kitaev, N. et al. "Constituency Parsing with a Self-Attentive Encoder." Proceedings of the 56th Annual Meeting of the Association for Computational Linguistics, vol. 1, Jul. 2018, pp. 2676-2686.

Krishnamurthy, R. et al. "Controlled Natural Language Framework for Generating Assertions from Hardware Specifications." 2019 IEEE 13th International Conference on Semantic Computing (ICSC), Jan. 30-Feb. 1, 2019, pp. 367-370.

Manning, C. D. et al. "The Stanford CoreNLP Natural Language Processing Toolkit." Proceedings of the 52nd Annual Meeting of the Association for Computational Linguistics: System Demonstrations, Jun. 23-24, 2014, pp. 55-60.

Parthasarathy, G. et al. "SpecToSVA: Circuit Specification Document to SystemVerilog Assertion Translation." Document Intelligence Workshop at KDD, Aug. 15, 2021, pp. 1-5.

PCT International Search Report and Written Opinion, PCT Application No. PCT/US2021/060302, Mar. 14, 2022, 16 pages.

Ratner, A. et al. "Snorkel: Rapid Training Data Creation with Weak Supervision." Proceedings VLDB Endowment, vol. 11, No. 3, Nov. 2017, pp. 269-282.

Ratner, A. et al. "Training Complex Models with Multi-Task Weak Supervision." Machine Learning, arXiv:1810.02840, Dec. 7, 2018, pp. 1-31.

Sagae, K. et al. "A Best-First Probabilistic Shift-Reduce Parser." Proceedings of the COLING/ACL 2006 Main Conference Poster Sessions, Jul. 2006, pp. 691-698.

Soeken, M. et al. "Automating the Translation of Assertions Using Natural Language Processing Techniques." Proceedings of the 2014 Forum on Specification and Design Languages (FDL), Oct. 14-16, 2014, pp. 1-8.

Walsh, T. "Stochastic Constraint Programming." ECAI '02: Proceedings of the 15th European Conference on Artificial Intelligence, Jul. 2002, pp. 111-115.

Zhao, J. et al. "Automatic Assertion Generation from Natural Language Specifications Using Subtree Analysis." 2019 Design, Automation & Test in Europe Conference & Exhibition (Date), Mar. 25-29, 2019, pp. 598-601.

\* cited by examiner

AUTOMATED TRANSLATION OF DESIGN SPECIFICATIONS OF ELECTRONIC CIRCUITS

RELATED APPLICATION

This application claims the benefit of U.S. Provisional Application No. 63/119,523, filed Nov. 30, 2020, which is incorporated by reference in its entirety.

TECHNICAL FIELD

The present disclosure relates to simulation and emulation of electronic circuits, and more specifically to automatically generating code to simulate or emulate the electronic circuit from a design specification written in a natural language.

BACKGROUND

Assertion-based verification is a verification technique for determining whether a design of an electronic circuit conforms to a specification and help identify errors during the design process. These assertions can be complex and difficult to write since verification engineers manually translate a natural language specification to a regular language that can be compiled and automatically checked (such as SystemVerilog). The manual translation process can add significant costs in the hardware design and verification cycle in terms of productivity and time—sometimes as much as 50% of the hardware design costs.

SUMMARY

Disclosed are example processes and systems for translating an intellectual property (IP) block (e.g., defined circuit design) specification (e.g., written in the English language) to SystemVerilog Assertions. In some embodiments, the specification for a design of an electronic circuit is received. An example system parses the specification to identify one or more sentences, each sentence specifying a condition for the design of the electronic circuit to be satisfied. From the one or more identified sentences, the system extracts semantic concepts. Additionally, for each sentence of the one or more identified sentences, the system determines whether the sentence is translatable. If a target sentence is translatable, the system generates a parse tree for the target sentence, and generates a probabilistic shift-reduce schedule for the generated parse tree. Using the generated probabilistic shift-reduce schedule and optionally the generated parse tree, the system generates code for verifying the condition specified in the target sentence. In some embodiments, to generate the code, the system parses the target sentence using the generated probabilistic shift-reduce schedule.

BRIEF DESCRIPTION OF THE DRAWINGS

The disclosure will be understood more fully from the detailed description given below and from the accompanying figures of embodiments of the disclosure. The figures are used to provide knowledge and understanding of embodiments of the disclosure and do not limit the scope of the disclosure to these specific embodiments. Furthermore, the figures are not necessarily drawn to scale.

DETAILED DESCRIPTION

Aspects of the present disclosure relate to translating circuit design specifications from a natural language to a hardware description or a hardware verification language.

Disclosed is a system and process that utilizes Machine Learning (ML) and Natural Language Processing (NLP) to automatically synthesize verification items. The disclosed system and process automatically parses natural language statements in specification documents to extract data-representations that are meaningful in the machine-translation flow. The disclosed system then generates syntactically correct and semantically accurate translations in a target language (such as SystemVerilog Assertions (SVA)) from the extracted data.

Figure 1:
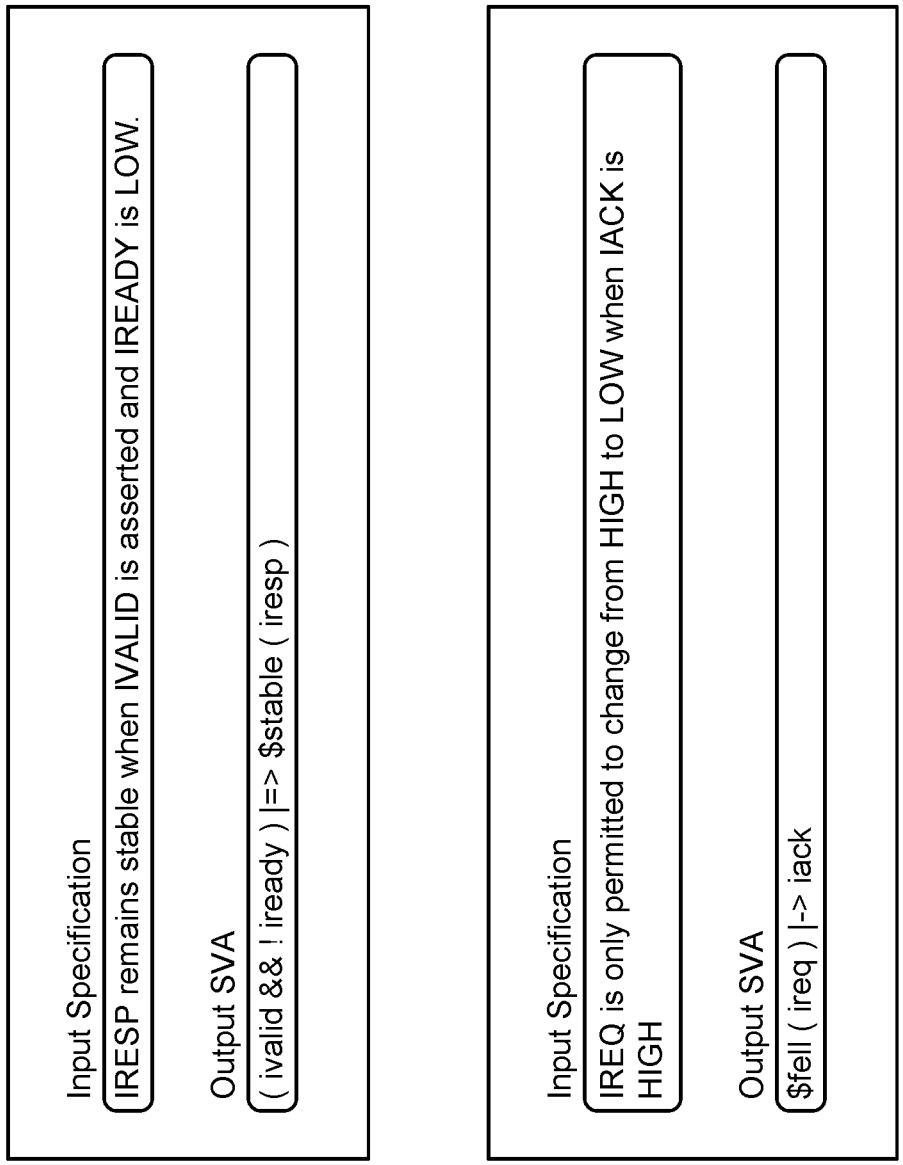
FIG. 1 illustrates a translation of sentences from a design specification into a hardware verification language (such as SystemVerilog Assertions), according to one embodiment.

For example, FIG. 1 illustrates a translation of sentences from a design specification into a hardware verification language (such as SVA), according to one embodiment. In the examples shown in FIG. 1, a first sentence "IRESP remains stable when IVALID is asserted and IREADY is LOW" written in a natural language (in this case, English) is translated to "(ivalid &&! iready)|=>$stable (iresp)." Similarly, a second sentence "IREQ is only permitted to change from HIGH to LOW when IACK is HIGH" is translated to "$fell (ireq)|→iack."

Advantages of the present disclosure include, but are not limited to, reducing the time to generate code for simulating or emulating electronic circuits, and reducing the error rate in the code used for simulating or emulating the electronic circuits. For instance, by using NLP and ML models, the disclosed system can classify sentences, phrases, and token spans within the design specification and create a document database. Moreover, by using ML models to parse the design specification and to determine what actions to take for each token or token span extracted from the design specification, the disclosed system can generate code for verifying the design of an electronic circuit. The accuracy of the models can be improved by using a feedback mechanism to enable users to identify erroneous translations, provide corrections to the erroneous translations, and retrain the ML models based on the feedback provided by the users.

Configuration Overview

Embodiments relate to a system for translating design specifications of an electronic circuit. In one embodiment, the design specification is parsed to identify one or more sentences. From the one or more identified sentences, the system extracts semantic concepts. Additionally, for each sentence of the one or more identified sentences, the system determines whether the sentence is translatable. If a target sentence is translatable, the system generates a parse tree for the target sentence, and generates a probabilistic shift-reduce schedule for the generated parse tree. Using the generated probabilistic shift-reduce schedule and optionally the generated parse tree, the system generates code for verifying the condition specified in the target sentence. In some embodiments, to generate the code, the system parses the target sentence using the generated probabilistic shift-reduce schedule.

In one embodiment, when parsing the specification, the system generates a specification document database storing information extracted from the received specification.

In one embodiment, when determining whether a sentence is translatable, the system applies a set of weak learners. Each weak learner receives as input a set of tokens extracted from the sentences and outputs a binary label. Moreover, the system applies a binary classifier based on the binary labels for each of the set of weak learners.

In one embodiment, when extracting semantic concepts from the one or more identified sentences, the system applies a trained model. The trained model receives as inputs word embeddings for words in the one or more identified sentences. The trained model is configured to detect sequence of tokens having semantic meaning.

In one embodiment, when generating a parse tree for the target sentence, the system groups tokens in the target sentence into one or more phrases that have semantic meaning, and encodes the grouped tokens in the target sentence into a syntactic parse tree. In one embodiment, a phrase from the one or more phrases comprises multiple sub-phrases each having semantic meaning.

In one embodiment, when generating a parse tree for a target sentence, the system identifies one or more concept phrases in the parse trees and replaces the one or more identified concept phrases with a replacement token.

In one embodiment, the tokens in the target sentence are grouped using a recursive neural network. In one embodiment, the recursive neural network comprises a layer of tree-LSTM (long short-term memory) node.

In one embodiment, when generating a probabilistic shift-reduce schedule for the generated parse tree, the system creates a pointer for traversing the parse tree, the pointer configured to create a new pointer in response to traversing the parse tree for at least one step. In one embodiment, the new pointer is created based on a current state of a traversal of the parse tree. In one embodiment, the probabilistic shift-reduce schedule is generated using at least a neural network layer. In one embodiment, the pointer probabilistically determines to either execute a shift action or a reduce action on a token of the target sentence.

In one embodiment, when generating code for verifying the condition specified in the target sentence, the system retrieves a token from the parse tree and determines an action by applying the probabilistic shift-reduce schedule. If the determined action is a reduce action, the system determines whether the token is a replace token. If the token is a replace token, the system replaces the token with a semantic concept extracted from the one or more identified sentences. Alternatively, if the token is not a replace token, the system adds the token to the code. Additionally, if the determined action is a shift action, the system retrieves a new token from the parse tree and determines a new action by applying the probabilistic shift-reduce schedule. Alternatively, if the action is a terminate action, the system appends a semicolon to the code.

Design Specification Translation System

Figure 2:
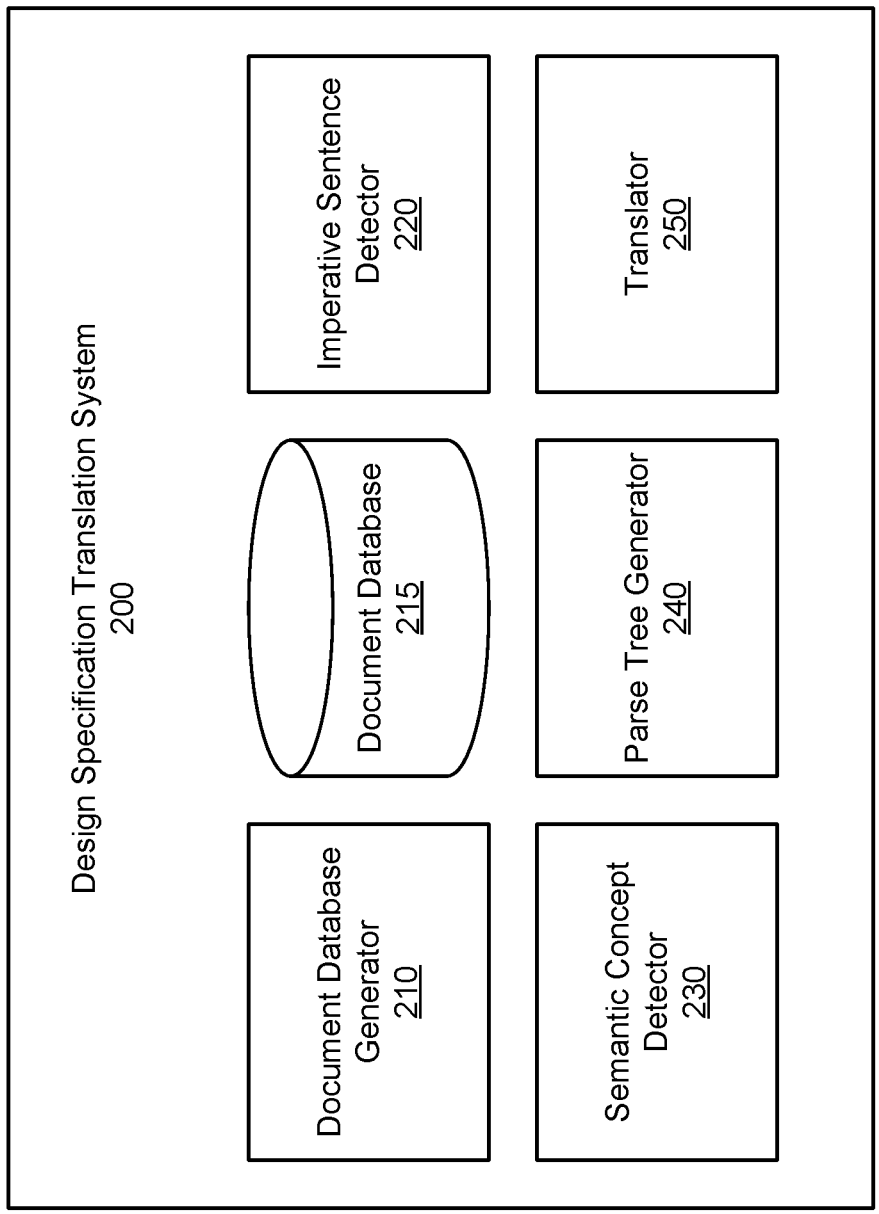
FIG. 2 illustrates a block diagram of a design specification translation system, according to one embodiment.

FIG. 2 illustrates a block diagram of a design specification translation system 200, according to one embodiment. The design specification translation system 200 includes a document database generator 210, a document database 215, an imperative sentence detector, 220, a semantic concept detector 230, a parse tree generator 240, and a translator 250. In various embodiments, the design specification translation system 200 includes fewer or additional components. In some embodiments, the design specification translation system 200 also includes different components. In some embodiments, the design specification translation system 200 is implemented using the computer system 900 of FIG. 9 or the host system of FIG. 8. In some embodiments, the design specification translation system 200 is implemented using multiple computing systems, each implementing one or more modules of the design specification translation system 200.

The document database generator 210 parses through a document containing the design specification of a circuit, extracts the sentences from the document, and stores the sentences in the document database 215. In some embodiments, the document database is used as a primary data store and as a knowledge data store for the entire design specification translation system 200. In other embodiments, the design specification translation system 200 creates a new document database for each document being processed. Alternatively, the design specification translation system 200 may maintain a global database to be used as a knowledge data store for training the various models used by the design specification translation system 200, and generates a document specific document database used for storing the information that is specific to the document for translating the document.

In some embodiments, the document database 215 includes a documents table that stores general information about one or more documents. For example, the documents table stores a document identification (document ID), information about the ownership or authorship of the document, temporal information about the creation of the document (e.g., information regarding when the document was created, and temporal information about the modification of the document (e.g., information regarding when the document was last modified). In various embodiments, the documents table includes fewer or additional fields or columns. In some embodiments, the documents table also includes different fields or columns.

Additionally, the document database 215 may include a sections table that stores information about one or more sections of a document. For example, the sections table stores a section identification (section ID), a document identification for the document associated with the section, information about a page number within the document where the section starts, information about a page number within the document where the section ends, and a title of the section. In various embodiments, the sections table includes fewer or additional fields or columns. In some embodiments, the sections table also includes different fields or columns.

Moreover, the document database 215 may include a sentences table that stores information about one or more sentences in a document. For example, the sentences table stores a sentence identification (sentence ID), a text of the sentence, an identification of the source of the sentence, an identification of the section the sentence was extracted from, information about the location of the sentence within the document (e.g., page number and sentence number within page), metadata about the sentence, and information about modifications made to the sentence (e.g., whether the sentence has been modified, an author of the modification, and a timestamp of the modification).

In some embodiments, the document database generator 210 parses the natural language statements in a document to identify sentences within the document, and analyzes the identified sentences to populate the document database 215. For example, the document database generator performs text extraction, sentence detection, tokenization, part-of-speech tagging, named-entity tagging, and key phrase recognition to each identified sentence.

The imperative sentence detector (ISD) 220 classifies sentences as being either translatable or non-translatable. In some embodiments, for each sentence identified in a document, the ISD 220 applies a trained binary classifier to the sentence and determines whether the sentence can be translated. In some embodiments, the ISD 220 determines a score indicative of a likelihood that the sentence is translatable. Moreover, the ISD 220 compares the score to a threshold value to classify the sentence as translatable or non-translatable.

In some embodiments, the ISD 220 applies a random forest binary classifier over a set of weak learners. In some embodiments, the weak learners receive as inputs an order set of tokens and output a binary label (e.g., to be translated or not to be translated). Each weak learner may use one or more techniques such as regular expressions or rule-based procedures based on part-of-speech tags to select the binary label for a sentence. Moreover, in some embodiments, the binary labels outputted by the weak learners are provided as inputs to a binary classifier to determine whether the sentence is translatable.

Figure 3:
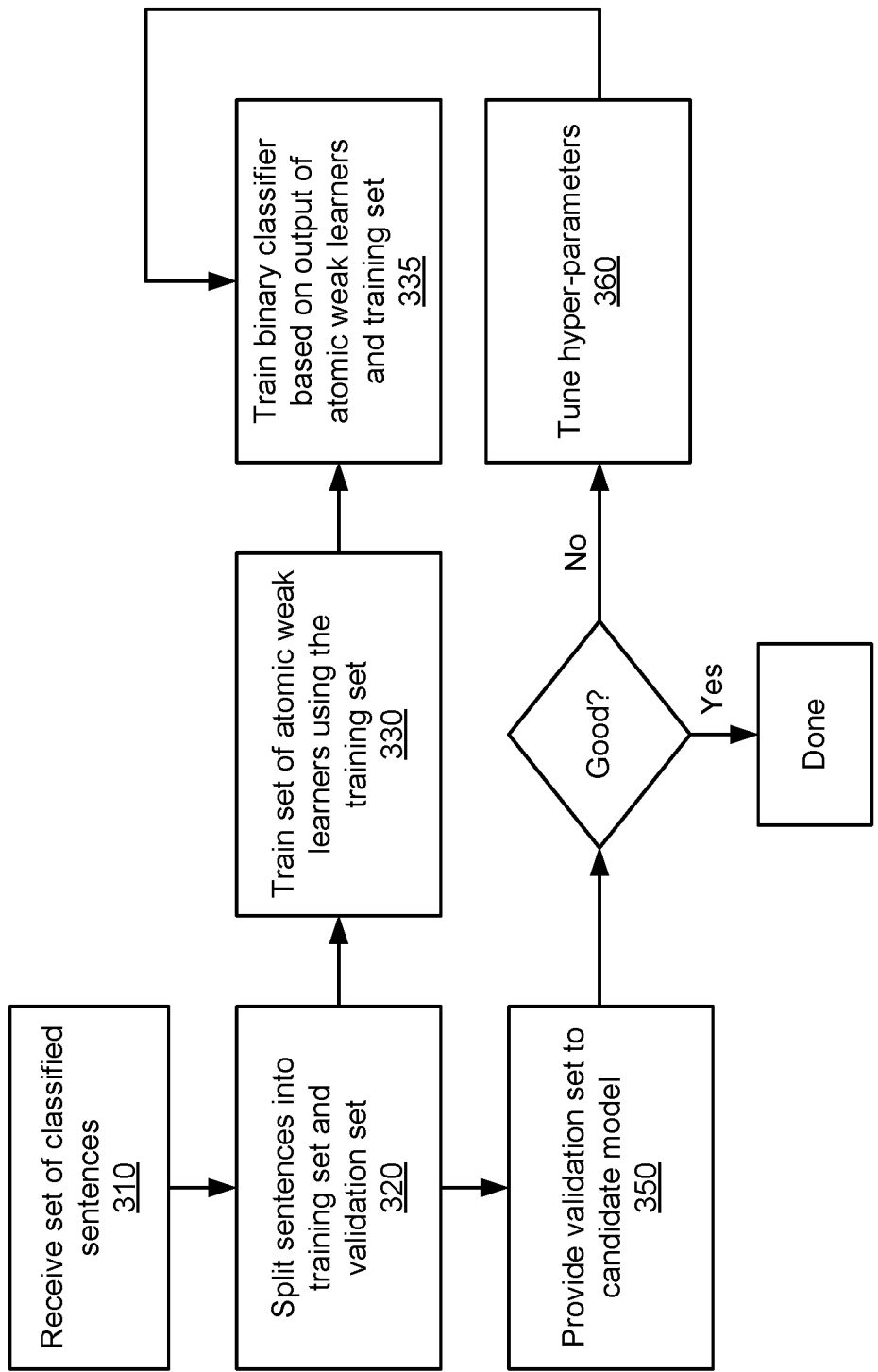
FIG. 3 illustrates a flow diagram of a process for training the binary classifier for determining whether a sentence is translatable, according to one embodiment.

FIG. 3 illustrates a flow diagram of a process for training the binary classifier for determining whether a sentence is translatable, according to one embodiment. To train the binary classifier, the ISD 220 receives 310 a set of classified sentences. In some embodiments, each of sentences received by the ISD 220 during the training process has a label indicating whether the sentence is translatable. The ISD 220 then splits 320 the received sentences into a training set and a validation set. The ISD 220 trains the binary classifier using the training set, and validates the accuracy of the binary classifier using the validation set. Specifically, the ISD 220 trains 330 a set of atomic weak learners using the training set, and trains 335 the binary classifier based on the output of the atomic weak learners and/or the sentences in the training set. Moreover, the ISD 220 provides 350 the sentences in the validation model to the classifier trained at steps 330 and 335, and determines an accuracy of the classifier. If the accuracy of the classifier is below a set threshold, the ISD 220 tunes 360 the hyper-parameters of the classifier accordingly. Alternatively, if the accuracy of the classifier is above the set threshold, the ISD ends the training process.

The semantic concept detector (SCD) 230 detects token sequences in a target sentence that corresponds to semantic concepts. For example, the SCD 230 identifies variable names, variable semantics (such as clocks and rests), registers, bit-vectors, bit-fields, Boolean logic, and temporal behavior (e.g., transitioning from one value to another over time).

The SCD 230 may use a multilayer convolutional neural network for detecting token spans and assigning a label to the detected token spans. In some embodiment, to train the SCD model, sentences from a training set, as well as information generated during sentence pre-processing for the sentences in the training set are used. For example, sentence pre-processing performed on the sentences in the training set includes tokenization, part-of-speech tagging, chunking, and constituency parsing. In addition, the SCD model is trained by creating a global set of labels that includes a set of keywords and operators in the target language (such as SystemVerilog).

In some embodiments, the SCD 230 additionally uses one or more rule-based routines to tag detected token spans in a sentence with a corresponding label. The rules used may include using regular expressions and heuristic combinations of part-of-speech tags. For example, the SCD 230 may detect token spans corresponding to variable names by identifying words that are written using upper case letters (e.g., CLOCK or SIGNAL names). In another example, the SCD 230 detects token spans that repeats multiple times throughout a document. In yet another example, the SCD 230 receives custom rules provided by a user and applies the user defined rule to detect token spans corresponding to one or more labels.

The parse tree generator 240 generates a parse tree from a target sentence to translate the sentence from a natural language to a target language. In some embodiments, the parse tree (or syntax tree) is an ordered, rooted tree that represents the syntactic structure of a string (e.g., sentence) according to some context-free grammar. The parse tree generator 240 uses the target sentence as a guide to yield a parse schedule using shift-reduce operations for translating the sentence from the natural language to the target language.

In some embodiments, the parse tree generator 240 generates a first parse tree for a target sentence. In some embodiments, the first parse tree is an approximation parse tree when the natural language of the sentence does not have a regular grammar. In some embodiments, the first parse tree is a constituency tree created using a first trained model (e.g., a generator network implemented using a deep neural network). For example, the parse tree generator 240 uses a probabilistic parser, such as a recursive neural network having a layer of Tree-LSTM (long short term memory) nodes to encode the structure of a syntactic parse tree that groups the tokens in a sentence into phrases that have semantic meaning and may recursively be composed of sub-phrases. As used herein, a constituency tree is a parse tree corresponding to constituency or phrase-structured grammars (such as Chomsky grammars). In some embodiments, constituency trees include interior nodes that are labeled non-terminal categories of grammar. Moreover, constituency trees may include leaf nodes that are labeled by terminal categories.

In some embodiments, the parse tree generator 240 includes a second model (e.g., a pointer network) that creates a pointer state to traverse the parse tree encoding in a specified order (e.g., stack order). The pointer state produces anew state at each step of the tree traversal given the current state of the traversal. This encodes a shift-reduce schedule for the parse tree. In some embodiments, the pointer network determines a probability that a next action is a reduce action given a stream of tokens from a constituency tree.

In some embodiments, two or more models are trained using constituency trees from sentences in a training data set to create a joint encoding of parse trees and a traversal that probabilistically detects shifts as well as reduce actions. That is, the parse tree generator 240 may use a first model (e.g., a generator network) that generates a parse tree for a given sentence that encodes the order in which the set of tokens of a sentence are processed. Moreover, the parse tree generator 240 uses a second model (e.g., a pointer network) that receives the parse tree generated by the first model, and generates a sequence of shift and reduce instructions to process the set of tokens of the sentence in the order specified by the parse tree.

In some embodiment, the parse tree generator 240 post-processes the constituency tree to replace a set of token spans with a special token (e.g., "OOV"). In some embodiment, the parse tree generator 240 additionally adds special tokens (such as a Start of Sentence (SOS) token and an End of Sentence (EOS) token). For example, the parse tree generator 240 replaces token spans corresponding to reserved keywords, or vernacular phrases with the special token. In some embodiments, the post-processing is performed using a post-order traversal of the constituency tree and results in an enhanced constituency tree. The enhanced constituency tree increases the probability that tree and the pointer will be able to represent the boundaries of phrases and sub-phrases with increased accuracy.

Figure 4:
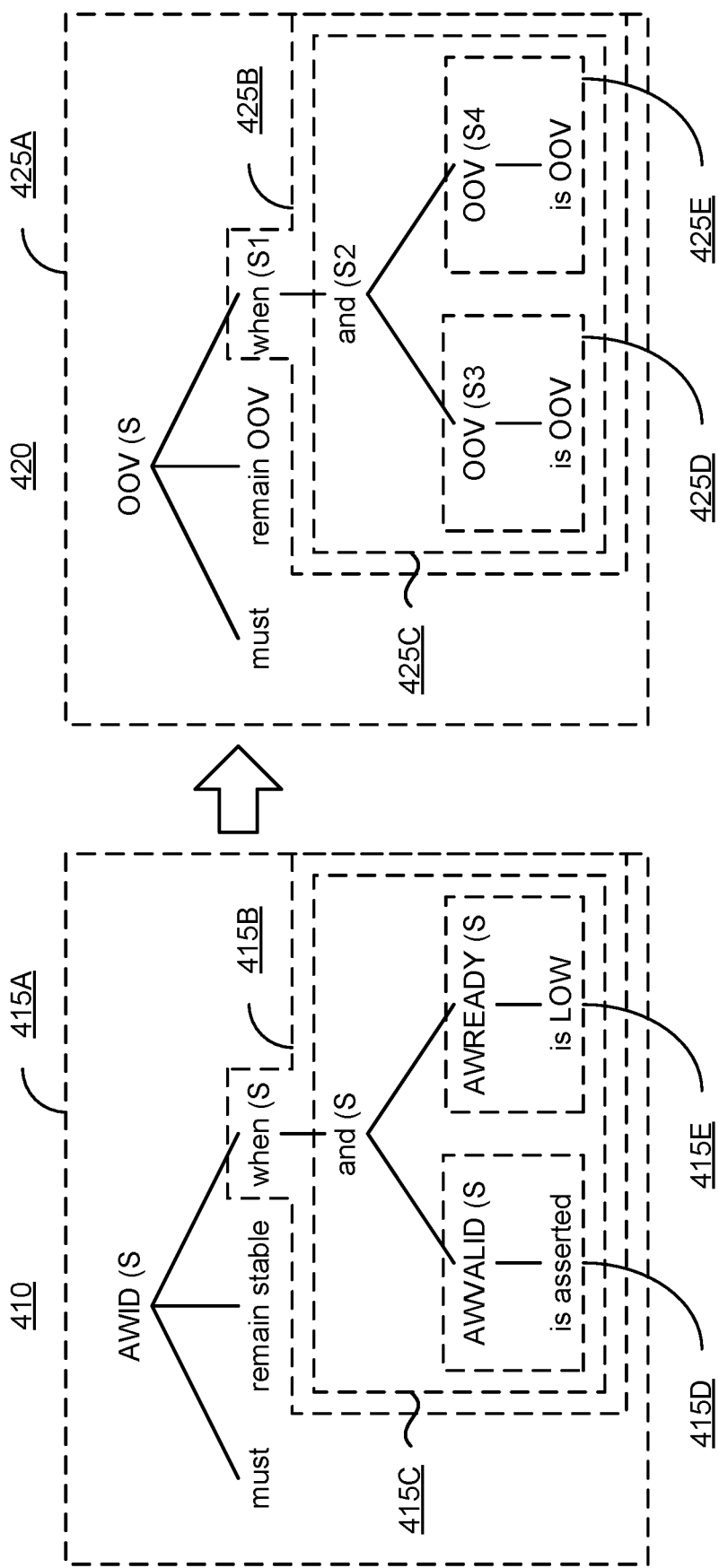
FIG. 4 illustrates a constituency tree that is processed to generate an enhanced constituency tree, according to one embodiment.

FIG. 4 illustrates a constituency tree 410 that is processed to generate an enhanced constituency tree 420, according to one embodiment. The constituency tree 410 corresponds to the sentence "AWID must remain stable when AWVALID is asserted and AWREADY is LOW." The constituency tree 410 includes a set of sub-phrases that are marked with the "(S" marker. For example, the constituency tree has a first sub-phrase 415A that starts with the token "AWID," a second sub-phrase 415B that starts with the token "when," a third sub-phrase 415C that starts with the token "and," a fourth sub-phrase 415D that starts with the token "AWVALID," and a fifth sub-phrase 415E that starts with the token "AWREADY."

The parse tree generator 240 generates the enhanced constituency tree 420 by replacing a set of tokens from the constituency tree 410 with a replace token "OOV." Specifically, the parse tree generator 240 replaces the token "AWID," "AWVALID," and "AWREADY" that corresponds to signal names with the replace token "OOV." Moreover, the parse tree generator 240 replaces the tokens "stable," "asserted," and "LOW" with the replace token "OOV." In some embodiments, the parse tree generator 240 additionally uses different markers or tags to mark each of the sub-phrases in the sentence. For example, in the enhanced parse tree 420 of FIG. 4, the first sub-phrase 425A is marked with the "(S" marker, the second sub-phrase 425B is marked with the "(S1" marker, the third sub-phrase 425C is marked with the "(S2" marker, the fourth sub-phrase 425D is marked with the "(S3" marker, and the fifth sub-phrase 425E is marked with the "(S4" marker.

The translator 250 traverses both the shift-reduce schedule and the parse tree in lock-step, and uses the predicted shift-reduce actions at each token to generate a translation of a sentence in the target language. In some embodiments, the translator 250 receives an enhanced constituency tree (e.g., generated by the tree generator 240), and converts the enhanced constituency tree into a sequence of tokens that is provided to the probabilistic shift-reduce parser. The probabilistic shift-reduce parser generates a sequence of shift-reduce actions (a shift-reduce schedule) represented by pointer states as an implicit bottom-up traversal equivalent to a stack of shift-reduce actions. Moreover, the probabilistic shift-reduce parser generates a sequence of translated keywords, special tokens (such as the "OOV" symbol), and an end of sequence marker. The translator then translates the target sentence by parsing the target sentence using the sequence of shift-reduce actions, and the sequence of translated keywords, special tokens, and end of sequence marker. In some embodiments, while translating the target sentence, the translator 250 keeps track of shift actions for every token, by tracking the parent and child constituency nodes in the tree. Moreover, the translator 250 keeps track of the last generated special token.

Figure 5:
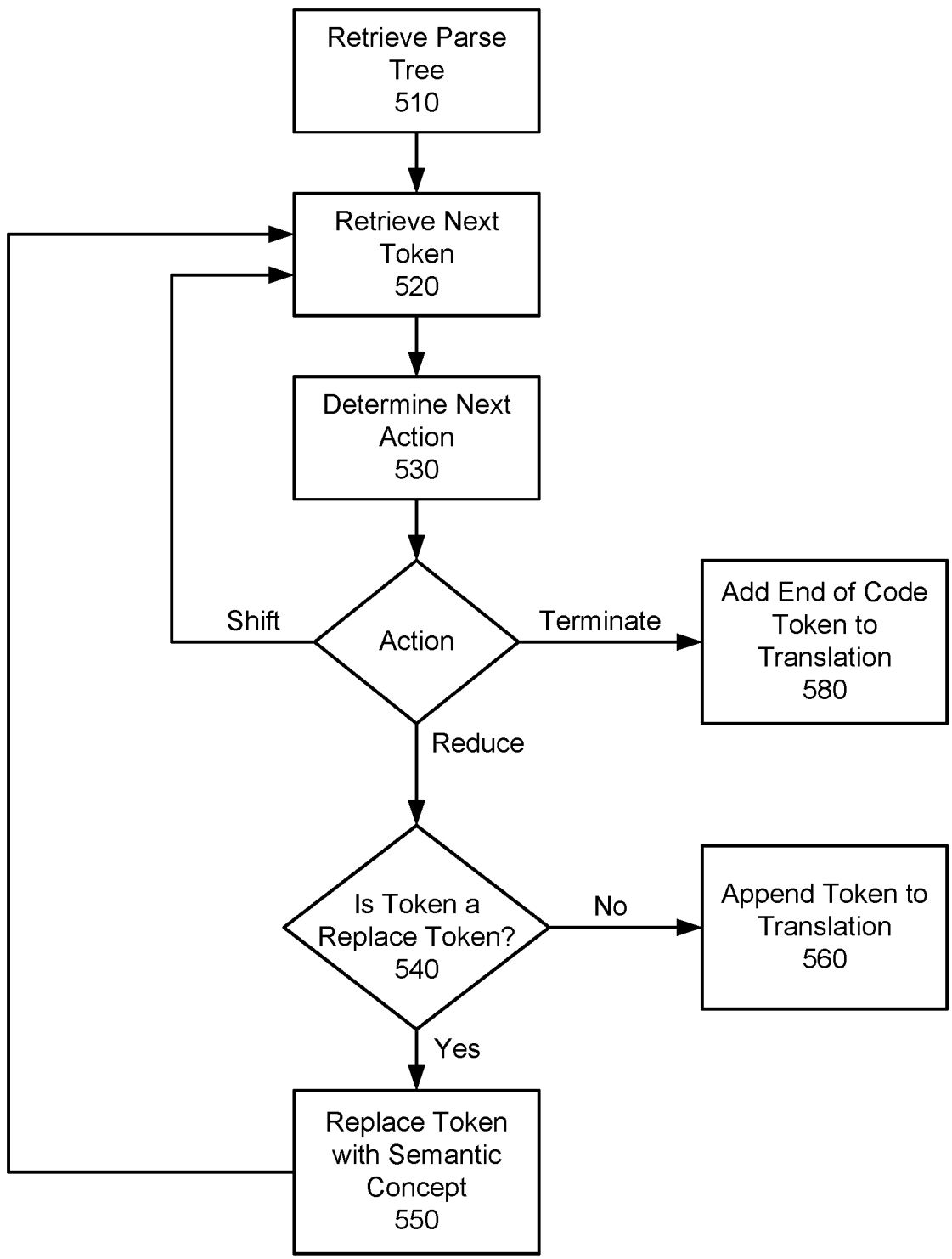
FIG. 5 illustrates a flow diagram of a process for translating a sentence to a target language, according to one embodiment.

FIG. 5 illustrates a flow diagram of a process for translating a sentence to a target language, according to one embodiment. The translator 250 receives 510 a parse tree from the parse tree generator 240. In some embodiments, the parse tree is an enhanced constituency tree. The translator 250 retrieves 520 a next token from the sentence based on the parse tree. The translator 250 inputs the retrieved token to a probabilistic parser for determining a next action to take. In some embodiments, the probabilistic parser selects between one of three actions: a shift action, a reduce action, and a terminate action.

If the determined action is a shift action, the process loops back to step 520. In some embodiments, a shift action advances the input stream (i.e., the sequence of tokens as specified by the parse tree) by one token. In some embodiments, the translator 250 keeps executing shift actions until the probabilistic parser determines a reduce action as the next action (e.g., until the probabilistic parser determines that the probability of a reduce action is larger than a threshold value). In some embodiments, the threshold for comparing the probability that the next action is a reduce action is a learned threshold that is determined during a training phase. In some embodiments, the translator 250 may override the threshold based on one or more phrases stored in a dictionary. That is, the translator 250 may determine that a next action is a reduce action even if the probability that the next action is a reduce action is lower than the threshold value if a token subsequence matches a token subsequence stored in the dictionary. For example, the translator 250 may identify that a token subsequence "must rise" matches a token subsequence stored in the dictionary, and may induce a reduce action to insert a token $rose even if the probability that the next action is a reduce action is lower than the learned threshold value.

Alternatively, if the determined action is a reduce action, the translator 250 determines whether the token is a replace token (such as the "OOV" token). If the token is a replace token, the translator 250 replaces the replace token with a semantic concept from the semantic concept database. In some embodiments, the semantic concept to replace the replace token is selected based on the position of the replace token within the parse tree. In some embodiments, the semantic concept is translated to the target language using a set of replacement rules. If the token is not a replace token, the translator 250 appends 560 the token to the translation.

In some embodiments, the translator 250 continues to perform shift and reduce actions until all the tokens have been consumed. In some embodiments, when all the tokens have been consumed, the probabilistic parser determines a terminate action as the next action. Once the probabilistic parser determines the terminate action to be the next action, the translator appends 580 an end of code token (such as a semicolon) to the translation.

Translation Algorithm

Figure 6:
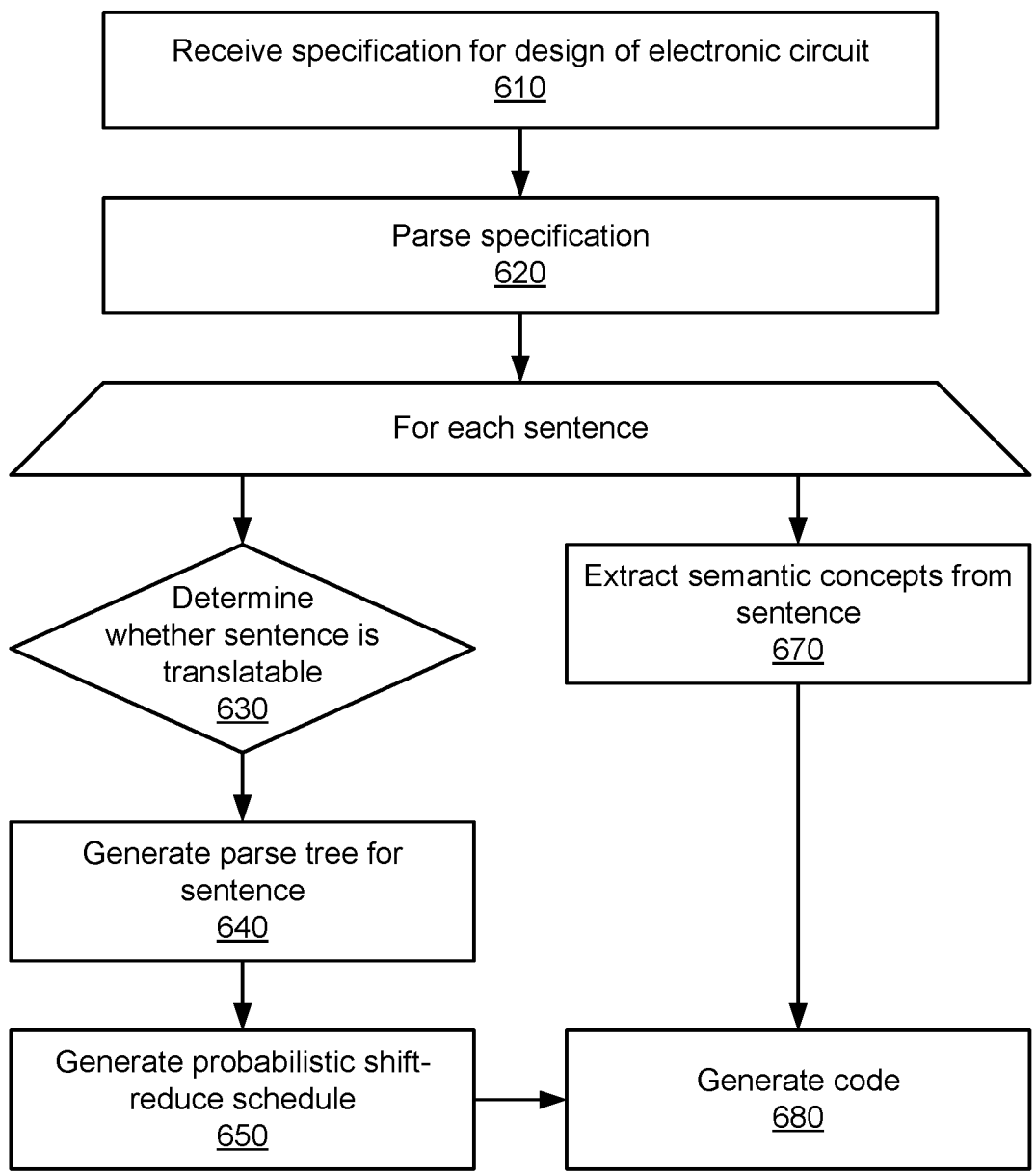
FIG. 6 illustrates a flow diagram of a process for translating a specification for a design of an electronic circuit, according to one embodiment.

FIG. 6 illustrates a flow diagram of a process for translating a specification for a design of an electronic circuit, according to one embodiment. The design specification translation system 210 receives 610 a specification for the design of an electronic circuit. The design specification may be received in one of many formats, such as plain text format (TXT), a rich text format (RTF), a MICROSOFT WORD format (DOC or DOCX), an open document format (ODF), a portable document format (PDF), etc. In some embodiments, the design specification is received in a natural language (such as English). In some embodiments, the design specification translation system 210 determines whether the design specification is written in one of a set of supported natural languages. Alternatively, the design specification translation system 210 may determine a natural language used in the design specification, and may translate the design specification from one natural language to another natural language (e.g., from a non-English language to English) using a natural language translator.

The document database generator 210 parses 620 the design specification and populates the document database 215. The document database generator 210 parses the design specification to identify one or more section within the design specification, and populates the sections table of the document database 215 to add entries corresponding to each of the identified sections. Moreover, the document database generator 210 parses the design specification to identify one or more sentences within the design specification, or within each of the sections identified in the design specification. The document database generator 210 populates the sentences table of the document database 215 to add entries corresponding to each of the identified sentences.

For each identified sentence in the design specification, the ISD 220 determines 630 whether the sentence is translatable to the target language. In some embodiments, the ISD 220 determines whether the sentence is an imperative sentence. The ISD 220 uses a random-forest binary classifier over a set of weak learners that classifies a target sentence as being either translatable or non-translatable.

For each identified sentence that has been classified as translatable, the parse tree generator 240 generates 640 a parse tree for the target sentence. In some embodiments, the parse tree is an English Language Parse (ELP) tree. In some embodiments, the parse tree is a constituency tree.

Moreover, the parse tree generator 240 generates 650 a probabilistic shift-reduce (PSR) schedule for the generated parse tree. In some embodiments, the PSR schedule is generated by creating a pointer for traversing the parse tree. The pointer is configured to probabilistically determine whether to execute a shift or a reduce action on a token of a target sentence. The pointer is also configured to create a new pointer at each step of the traversal of the parse tree. In some embodiments, the PSR schedule is generated using one or more trained models. For example, the PSR schedule is generated using at least a trained neural network.

In addition, for each sentence in the design document, the SCD 230 extracts 670 semantic concepts and stores the extracted semantic concepts in a semantic concept database. In some embodiments, to extract the semantic concepts from a target sentence, the SCD 230 applies a trained model to the target sentence. The trained model may receive as inputs, word embeddings for words in the target sentence. The trained model is then configured to identify sequences of tokens within the target sentence having semantic meaning.

Based on the parse tree, the PSR schedule, and/or the semantic concept database, the translator 250 translates each of the translatable sentences into the target language. For example, the translator 250 generates 680 code for encoding a target sentence based on the parse tree for the sentence, the PSR schedule generated from the parse tree of the sentence, and the semantic concept database.

In some embodiment, to translate a target sentence, the translator 250 retrieves a token from the parse tree corresponding to the target sentence. The translator 250 then determines an action by applying the probabilistic shift-reduce schedule. If the determined action is a reduce action, the translator 250 determines whether the token is a special token (such as a replace token). If the token is a replace token, the translator 250 replaces the token with a semantic concept stored in the semantic concept database. Alternatively, if the token is not a replace token, the translator 250 adds the token to the code.

Moreover, if the determined action is a shift action, the translator 250 retrieves a new token from the parse tree and determines a new action by applying the PSR schedule. Furthermore, if the determined action is a terminate action, the translator appends an end of code token (such as a semicolon).

Overview of EDA Design Flow

Figure 7:
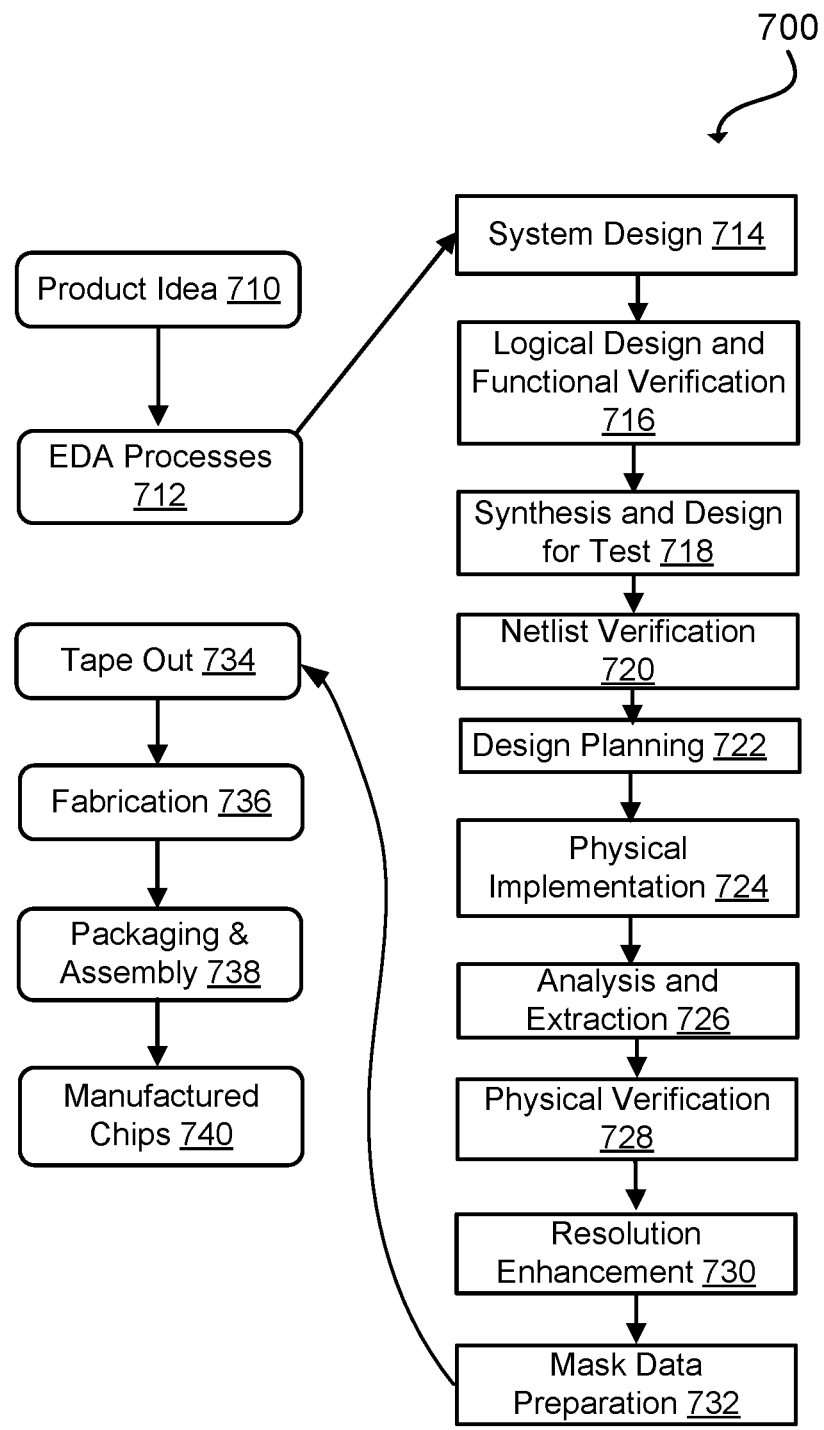
FIG. 7 depicts a flowchart of various processes used during the design and manufacture of an integrated circuit in accordance with some embodiments of the present disclosure.

FIG. 7 illustrates an example set of processes 700 used during the design, verification, and fabrication of an article of manufacture such as an integrated circuit to transform and verify design data and instructions that represent the integrated circuit. Each of these processes can be structured and enabled as multiple modules or operations. The term 'EDA' signifies the term 'Electronic Design Automation.' These processes start with the creation of a product idea 710 with information supplied by a designer, information which is transformed to create an article of manufacture that uses a set of EDA processes 712. When the design is finalized, the design is taped-out 734, which is when artwork (e.g., geometric patterns) for the integrated circuit is sent to a fabrication facility to manufacture the mask set, which is then used to manufacture the integrated circuit. After tape-out, a semiconductor die is fabricated 736 and packaging and assembly processes 738 are performed to produce the finished integrated circuit 740.

Specifications for a circuit or electronic structure may range from low-level transistor material layouts to high-level description languages. A high-level of abstraction may be used to design circuits and systems, using a hardware description language ('HDL') such as VHDL, Verilog, SystemVerilog, SystemC, MyHDL or OpenVera. The HDL description can be transformed to a logic-level register transfer level ('RTL') description, a gate-level description, a layout-level description, or a mask-level description. Each lower abstraction level that is a less abstract description adds more useful detail into the design description, for example, more details for the modules that include the description. The lower levels of abstraction that are less abstract descriptions can be generated by a computer, derived from a design library, or created by another design automation process. An example of a specification language at a lower level of abstraction language for specifying more detailed descriptions is SPICE, which is used for detailed descriptions of circuits with many analog components. Descriptions at each level of abstraction are enabled for use by the corresponding tools of that layer (e.g., a formal verification tool). A design process may use a sequence depicted in FIG. 7. The processes described by be enabled by EDA products (or tools).

During system design 714, functionality of an integrated circuit to be manufactured is specified. The design may be optimized for desired characteristics such as power consumption, performance, area (physical and/or lines of code), and reduction of costs, etc. Partitioning of the design into different types of modules or components can occur at this stage.

During logic design and functional verification 716, modules or components in the circuit are specified in one or more description languages and the specification is checked for functional accuracy. For example, the components of the circuit may be verified to generate outputs that match the requirements of the specification of the circuit or system being designed. Functional verification may use simulators and other programs such as testbench generators, static HDL checkers, and formal verifiers. In some embodiments, special systems of components referred to as 'emulators' or 'prototyping systems' are used to speed up the functional verification.

During synthesis and design for test 718, HDL code is transformed to a netlist. In some embodiments, a netlist may be a graph structure where edges of the graph structure represent components of a circuit and where the nodes of the graph structure represent how the components are interconnected. Both the HDL code and the netlist are hierarchical articles of manufacture that can be used by an EDA product to verify that the integrated circuit, when manufactured, performs according to the specified design. The netlist can be optimized for a target semiconductor manufacturing technology. Additionally, the finished integrated circuit may be tested to verify that the integrated circuit satisfies the requirements of the specification.

During netlist verification 720, the netlist is checked for compliance with timing constraints and for correspondence with the HDL code. During design planning 722, an overall floor plan for the integrated circuit is constructed and analyzed for timing and top-level routing.

During layout or physical implementation 724, physical placement (positioning of circuit components such as transistors or capacitors) and routing (connection of the circuit components by multiple conductors) occurs, and the selection of cells from a library to enable specific logic functions can be performed. As used herein, the term 'cell' may specify a set of transistors, other components, and interconnections that provides a Boolean logic function (e.g., AND, OR, NOT, XOR) or a storage function (such as a flipflop or latch). As used herein, a circuit 'block' may refer to two or more cells. Both a cell and a circuit block can be referred to as a module or component and are enabled as both physical structures and in simulations. Parameters are specified for selected cells (based on 'standard cells') such as size and made accessible in a database for use by EDA products.

During analysis and extraction 726, the circuit function is verified at the layout level, which permits refinement of the layout design. During physical verification 728, the layout design is checked to ensure that manufacturing constraints are correct, such as DRC constraints, electrical constraints, lithographic constraints, and that circuitry function matches the HDL design specification. During resolution enhancement 730, the geometry of the layout is transformed to improve how the circuit design is manufactured.

During tape-out, data is created to be used (after lithographic enhancements are applied if appropriate) for production of lithography masks. During mask data preparation 732, the 'tape-out' data is used to produce lithography masks that are used to produce finished integrated circuits.

A storage subsystem of a computer system (such as computer system 900 of FIG. 9, or host system 807 of FIG. 8) may be used to store the programs and data structures that are used by some or all of the EDA products described herein, and products used for development of cells for the library and for physical and logical design that use the library.

Emulation Environment

Figure 8:
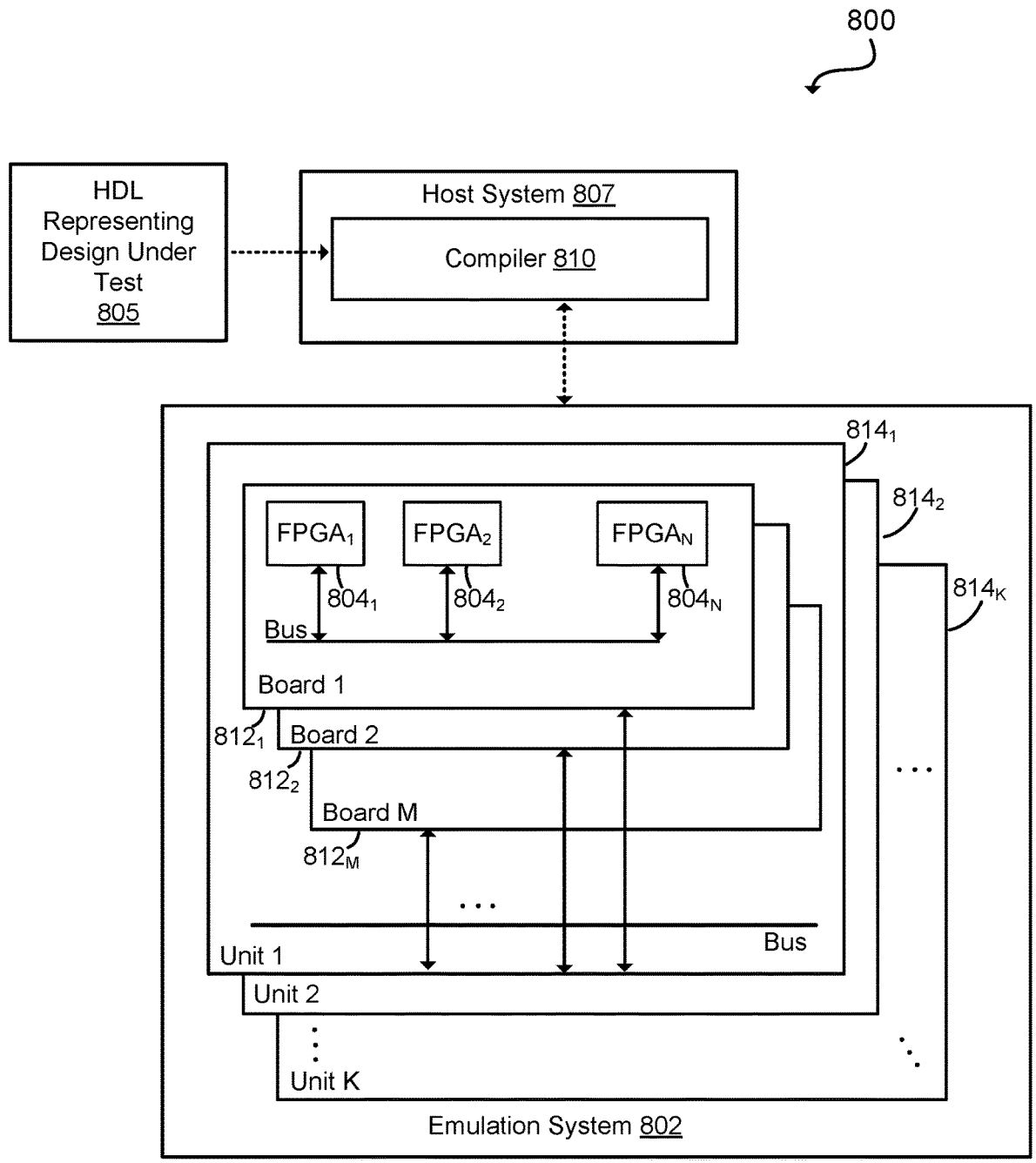
FIG. 8 depicts a diagram of an example emulation system in accordance with some embodiments of the present disclosure.

FIG. 8 depicts a diagram of an example emulation environment 800. An emulation environment 800 may be configured to verify the functionality of the circuit design. The emulation environment 800 may include a host system 807 (e.g., a computer that is part of an EDA system) and an emulation system 802 (e.g., a set of programmable devices such as Field Programmable Gate Arrays (FPGAs) or processors). The host system generates data and information by using a compiler 810 to structure the emulation system to emulate a circuit design. A circuit design to be emulated is also referred to as a Design Under Test ('DUT') where data and information from the emulation are used to verify the functionality of the DUT.

The host system 807 may include one or more processors. In the embodiment where the host system includes multiple processors, the functions described herein as being performed by the host system can be distributed among the multiple processors. The host system 807 may include a compiler 810 to transform specifications written in a description language that represents a DUT and to produce data (e.g., binary data) and information that is used to structure the emulation system 802 to emulate the DUT. The compiler 810 can transform, change, restructure, add new functions to, and/or control the timing of the DUT.

The host system 807 and emulation system 802 exchange data and information using signals carried by an emulation connection. The connection can be, but is not limited to, one or more electrical cables such as cables with pin structures compatible with the Recommended Standard 232 (RS232) or universal serial bus (USB) protocols. The connection can be a wired communication medium or network such as a local area network or a wide area network such as the Internet. The connection can be a wireless communication medium or a network with one or more points of access using a wireless protocol such as BLUETOOTH or IEEE 802.11. The host system 807 and emulation system 802 can exchange data and information through a third device such as a network server.

The emulation system 802 includes multiple FPGAs (or other modules) such as FPGAs $804_1$ and $804_2$ as well as additional FPGAs to $804_N$. Each FPGA can include one or more FPGA interfaces through which the FPGA is connected to other FPGAs (and potentially other emulation components) for the FPGAs to exchange signals. An FPGA interface can be referred to as an input/output pin or an FPGA pad. While an emulator may include FPGAs, embodiments of emulators can include other types of logic blocks instead of, or along with, the FPGAs for emulating DUTs. For example, the emulation system 802 can include custom FPGAs, specialized ASICs for emulation or prototyping, memories, and input/output devices.

A programmable device can include an array of programmable logic blocks and a hierarchy of interconnections that can enable the programmable logic blocks to be interconnected according to the descriptions in the HDL code. Each of the programmable logic blocks can enable complex combinational functions or enable logic gates such as AND, and XOR logic blocks. In some embodiments, the logic blocks also can include memory elements/devices, which can be simple latches, flip-flops, or other blocks of memory. Depending on the length of the interconnections between different logic blocks, signals can arrive at input terminals of the logic blocks at different times and thus may be temporarily stored in the memory elements/devices.

FPGAs $804_1$-$804_N$ may be placed onto one or more boards $812_1$ and $812_2$ as well as additional boards through $812_M$. Multiple boards can be placed into an emulation unit $814_1$. The boards within an emulation unit can be connected using the backplane of the emulation unit or any other types of connections. In addition, multiple emulation units (e.g., $814_1$ and $814_2$ through $814_K$) can be connected to each other by cables or any other means to form a multi-emulation unit system.

For a DUT that is to be emulated, the host system 807 transmits one or more bit files to the emulation system 802. The bit files may specify a description of the DUT and may further specify partitions of the DUT created by the host system 807 with trace and injection logic, mappings of the partitions to the FPGAs of the emulator, and design constraints. Using the bit files, the emulator structures the FPGAs to perform the functions of the DUT. In some embodiments, one or more FPGAs of the emulators may have the trace and injection logic built into the silicon of the FPGA. In such an embodiment, the FPGAs may not be structured by the host system to emulate trace and injection logic.

The host system 807 receives a description of a DUT that is to be emulated. In some embodiments, the DUT description is in a description language (e.g., a register transfer language (RTL)). In some embodiments, the DUT description is in netlist level files or a mix of netlist level files and HDL files. If part of the DUT description or the entire DUT description is in an HDL, then the host system can synthesize the DUT description to create a gate level netlist using the DUT description. A host system can use the netlist of the DUT to partition the DUT into multiple partitions where one or more of the partitions include trace and injection logic. The trace and injection logic traces interface signals that are exchanged via the interfaces of an FPGA. Additionally, the trace and injection logic can inject traced interface signals into the logic of the FPGA. The host system maps each partition to an FPGA of the emulator. In some embodiments, the trace and injection logic is included in select partitions for a group of FPGAs. The trace and injection logic can be built into one or more of the FPGAs of an emulator. The host system can synthesize multiplexers to be mapped into the FPGAs. The multiplexers can be used by the trace and injection logic to inject interface signals into the DUT logic.

The host system creates bit files describing each partition of the DUT and the mapping of the partitions to the FPGAs. For partitions in which trace and injection logic are included, the bit files also describe the logic that is included. The bit files can include place and route information and design constraints. The host system stores the bit files and information describing which FPGAs are to emulate each component of the DUT (e.g., to which FPGAs each component is mapped).

Upon request, the host system transmits the bit files to the emulator. The host system signals the emulator to start the emulation of the DUT. During emulation of the DUT or at the end of the emulation, the host system receives emulation results from the emulator through the emulation connection. Emulation results are data and information generated by the emulator during the emulation of the DUT which include interface signals and states of interface signals that have been traced by the trace and injection logic of each FPGA. The host system can store the emulation results and/or transmits the emulation results to another processing system.

After emulation of the DUT, a circuit designer can request to debug a component of the DUT. If such a request is made, the circuit designer can specify a time period of the emulation to debug. The host system identifies which FPGAs are emulating the component using the stored information. The host system retrieves stored interface signals associated with the time period and traced by the trace and injection logic of each identified FPGA. The host system signals the emulator to re-emulate the identified FPGAs. The host system transmits the retrieved interface signals to the emulator to re-emulate the component for the specified time period. The trace and injection logic of each identified FPGA injects its respective interface signals received from the host system into the logic of the DUT mapped to the FPGA. In case of multiple re-emulations of an FPGA, merging the results produces a full debug view.

The host system receives, from the emulation system, signals traced by logic of the identified FPGAs during the re-emulation of the component. The host system stores the signals received from the emulator. The signals traced during the re-emulation can have a higher sampling rate than the sampling rate during the initial emulation. For example, in the initial emulation a traced signal can include a saved state of the component every X milliseconds. However, in the re-emulation the traced signal can include a saved state every Y milliseconds where Y is less than X. If the circuit designer requests to view a waveform of a signal traced during the re-emulation, the host system can retrieve the stored signal and display a plot of the signal. For example, the host system can generate a waveform of the signal. Afterwards, the circuit designer can request to re-emulate the same component for a different time period or to re-emulate another component.

A host system 807 and/or the compiler 810 may include sub-systems such as, but not limited to, a design synthesizer sub-system, a mapping sub-system, a run time sub-system, a results sub-system, a debug sub-system, a waveform sub-system, and a storage sub-system. The sub-systems can be structured and enabled as individual or multiple modules or two or more may be structured as a module. Together these sub-systems structure the emulator and monitor the emulation results.

The design synthesizer sub-system transforms the HDL that is representing a DUT 805 into gate level logic. For a DUT that is to be emulated, the design synthesizer sub-system receives a description of the DUT. If the description of the DUT is fully or partially in HDL (e.g., RTL or other level of abstraction), the design synthesizer sub-system synthesizes the HDL of the DUT to create a gate-level netlist with a description of the DUT in terms of gate level logic.

The mapping sub-system partitions DUTs and maps the partitions into emulator FPGAs. The mapping sub-system partitions a DUT at the gate level into a number of partitions using the netlist of the DUT. For each partition, the mapping sub-system retrieves a gate level description of the trace and injection logic and adds the logic to the partition. As described above, the trace and injection logic included in a partition is used to trace signals exchanged via the interfaces of an FPGA to which the partition is mapped (trace interface signals). The trace and injection logic can be added to the DUT prior to the partitioning. For example, the trace and injection logic can be added by the design synthesizer sub-system prior to or after the synthesizing the HDL of the DUT.

In addition to including the trace and injection logic, the mapping sub-system can include additional tracing logic in a partition to trace the states of certain DUT components that are not traced by the trace and injection. The mapping sub-system can include the additional tracing logic in the DUT prior to the partitioning or in partitions after the partitioning. The design synthesizer sub-system can include the additional tracing logic in an HDL description of the DUT prior to synthesizing the HDL description.

The mapping sub-system maps each partition of the DUT to an FPGA of the emulator. For partitioning and mapping, the mapping sub-system uses design rules, design constraints (e.g., timing or logic constraints), and information about the emulator. For components of the DUT, the mapping sub-system stores information in the storage sub-system describing which FPGAs are to emulate each component.

Using the partitioning and the mapping, the mapping sub-system generates one or more bit files that describe the created partitions and the mapping of logic to each FPGA of the emulator. The bit files can include additional information such as constraints of the DUT and routing information of connections between FPGAs and connections within each FPGA. The mapping sub-system can generate a bit file for each partition of the DUT and can store the bit file in the storage sub-system. Upon request from a circuit designer, the mapping sub-system transmits the bit files to the emulator, and the emulator can use the bit files to structure the FPGAs to emulate the DUT.

If the emulator includes specialized ASICs that include the trace and injection logic, the mapping sub-system can generate a specific structure that connects the specialized ASICs to the DUT. In some embodiments, the mapping sub-system can save the information of the traced/injected signal and where the information is stored on the specialized ASIC.

The run time sub-system controls emulations performed by the emulator. The run time sub-system can cause the emulator to start or stop executing an emulation. Additionally, the run time sub-system can provide input signals and data to the emulator. The input signals can be provided directly to the emulator through the connection or indirectly through other input signal devices. For example, the host system can control an input signal device to provide the input signals to the emulator. The input signal device can be, for example, a test board (directly or through cables), signal generator, another emulator, or another host system.

The results sub-system processes emulation results generated by the emulator. During emulation and/or after completing the emulation, the results sub-system receives emulation results from the emulator generated during the emulation. The emulation results include signals traced during the emulation. Specifically, the emulation results include interface signals traced by the trace and injection logic emulated by each FPGA and can include signals traced by additional logic included in the DUT. Each traced signal can span multiple cycles of the emulation. A traced signal includes multiple states and each state is associated with a time of the emulation. The results sub-system stores the traced signals in the storage sub-system. For each stored signal, the results sub-system can store information indicating which FPGA generated the traced signal.

The debug sub-system allows circuit designers to debug DUT components. After the emulator has emulated a DUT and the results sub-system has received the interface signals traced by the trace and injection logic during the emulation, a circuit designer can request to debug a component of the DUT by re-emulating the component for a specific time period. In a request to debug a component, the circuit designer identifies the component and indicates a time period of the emulation to debug. The circuit designer's request can include a sampling rate that indicates how often states of debugged components should be saved by logic that traces signals.

The debug sub-system identifies one or more FPGAs of the emulator that are emulating the component using the information stored by the mapping sub-system in the storage sub-system. For each identified FPGA, the debug sub-system retrieves, from the storage sub-system, interface signals traced by the trace and injection logic of the FPGA during the time period indicated by the circuit designer. For example, the debug sub-system retrieves states traced by the trace and injection logic that are associated with the time period.

The debug sub-system transmits the retrieved interface signals to the emulator. The debug sub-system instructs the debug sub-system to use the identified FPGAs and for the trace and injection logic of each identified FPGA to inject its respective traced signals into logic of the FPGA to re-emulate the component for the requested time period. The debug sub-system can further transmit the sampling rate provided by the circuit designer to the emulator so that the tracing logic traces states at the proper intervals.

To debug the component, the emulator can use the FPGAs to which the component has been mapped. Additionally, the re-emulation of the component can be performed at any point specified by the circuit designer.

For an identified FPGA, the debug sub-system can transmit instructions to the emulator to load multiple emulator FPGAs with the same configuration of the identified FPGA. The debug sub-system additionally signals the emulator to use the multiple FPGAs in parallel. Each FPGA from the multiple FPGAs is used with a different time window of the interface signals to generate a larger time window in a shorter amount of time. For example, the identified FPGA can require an hour or more to use a certain amount of cycles. However, if multiple FPGAs have the same data and structure of the identified FPGA and each of these FPGAs runs a subset of the cycles, the emulator can require a few minutes for the FPGAs to collectively use all the cycles.

A circuit designer can identify a hierarchy or a list of DUT signals to re-emulate. To enable this, the debug sub-system determines the FPGA needed to emulate the hierarchy or list of signals, retrieves the necessary interface signals, and transmits the retrieved interface signals to the emulator for re-emulation. Thus, a circuit designer can identify any element (e.g., component, device, or signal) of the DUT to debug/re-emulate.

The waveform sub-system generates waveforms using the traced signals. If a circuit designer requests to view a waveform of a signal traced during an emulation run, the host system retrieves the signal from the storage sub-system. The waveform sub-system displays a plot of the signal. For one or more signals, when the signals are received from the emulator, the waveform sub-system can automatically generate the plots of the signals.

Computer Machine Architecture

Figure 9:
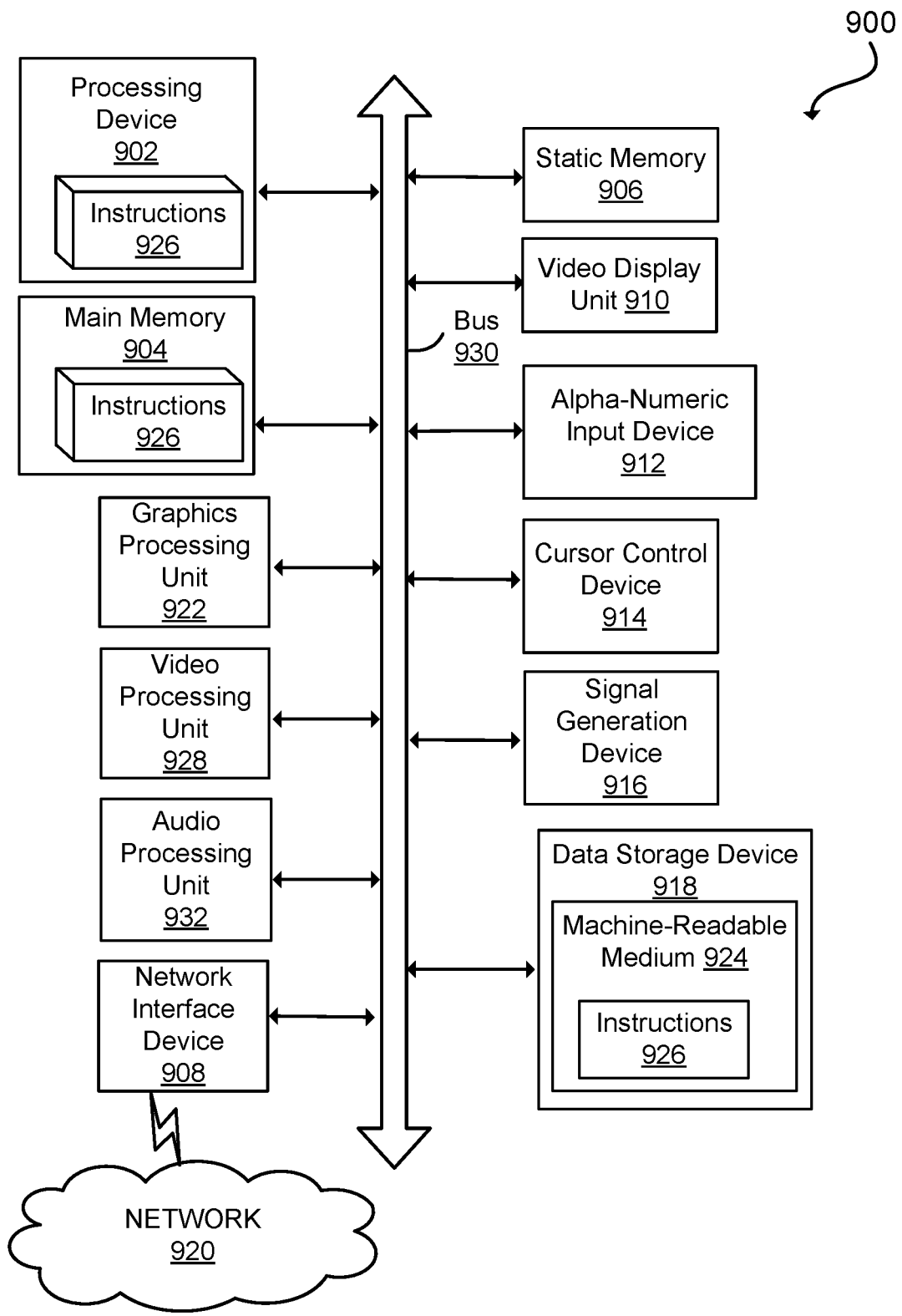
FIG. 9 depicts a diagram of an example computer system in which embodiments of the present disclosure may operate.

FIG. 9 illustrates an example machine of a computer system 900 within which a set of instructions, for causing the machine to perform any one or more of the methodologies discussed herein, may be executed. In alternative implementations, the machine may be connected (e.g., networked) to other machines in a LAN, an intranet, an extranet, and/or the Internet. The machine may operate in the capacity of a server or a client machine in client-server network environment, as a peer machine in a peer-to-peer (or distributed)

network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 900 includes a processing device 902, a main memory 904 (e.g., read-only memory (ROM), flash memory, dynamic random access memory (DRAM) such as synchronous DRAM (SDRAM), a static memory 906 (e.g., flash memory, static random access memory (SRAM), etc.), and a data storage device 918, which communicate with each other via a bus 930.

Processing device 902 represents one or more processors such as a microprocessor, a central processing unit, or the like. More particularly, the processing device may be complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 902 may also be one or more special-purpose processing devices such as an application specific integrated circuit (ASIC), a field programmable gate array (FPGA), a digital signal processor (DSP), network processor, or the like. The processing device 902 may be configured to execute instructions 926 for performing the operations and steps described herein.

The computer system 900 may further include a network interface device 908 to communicate over the network 920. The computer system 900 also may include a video display unit 910 (e.g., a liquid crystal display (LCD) or a cathode ray tube (CRT)), an alphanumeric input device 912 (e.g., a keyboard), a cursor control device 914 (e.g., a mouse), a graphics processing unit 922, a signal generation device 916 (e.g., a speaker), graphics processing unit 922, video processing unit 928, and audio processing unit 932.

The data storage device 918 may include a machine-readable storage medium 924 (also known as a non-transitory computer-readable medium) on which is stored one or more sets of instructions 926 or software embodying any one or more of the methodologies or functions described herein. The instructions 926 may also reside, completely or at least partially, within the main memory 904 and/or within the processing device 902 during execution thereof by the computer system 900, the main memory 904 and the processing device 902 also constituting machine-readable storage media.

In some implementations, the instructions 926 include instructions to implement functionality corresponding to the present disclosure. While the machine-readable storage medium 924 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine and the processing device 902 to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing disclosure, implementations of the disclosure have been described with reference to specific example implementations thereof. It will be evident that various modifications may be made thereto without departing from the broader spirit and scope of implementations of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense.

What is claimed is:

1. A non-transitory computer readable storage medium configured to store instructions, the instructions when executed by a processor cause the processor to:
receive a specification for a design of an electronic circuit;
parse the specification to identify one or more sentences, each sentence of the identified one or more sentences specifying a condition to be satisfied for the design of the electronic circuit;
for each sentence of the identified one or more sentences, determine whether the sentence of each sentence of the identified one or more sentences is translatable by:
applying a plurality of weak learners, wherein each weak learner of the plurality of weak learners receives a set of tokens extracted from the sentence of each sentence of the identified one or more sentences and outputs a binary label; and
applying a binary classifier based on the binary labels for each of the plurality of weak learners; and
in response to determining the sentence, as a target sentence, of each sentence of the identified one or more sentences is translatable, perform,
generating a parse tree for the target sentence;
generating a probabilistic shift-reduce schedule for the generated parse tree, wherein the probabilistic shift-reduce schedule includes a sequence of shift-reduce actions; and
generating a code by parsing the target sentence using the generated probabilistic shift reduce schedule for verifying that the condition specified in the target sentence is satisfied for the design of the electronic circuit.

2. The non-transitory computer readable storage medium of claim 1, wherein the instructions for generating the parse tree for the target sentence cause the processor to:
group tokens in the target sentence into one or more phrases that have a semantic meaning; and
encode the grouped tokens in the target sentence into a syntactic parse tree.

3. The non-transitory computer readable storage medium of claim 2, wherein the instructions for generating the parse tree for the target sentence further cause the processor to:
identify one or more concept phrases in the parse tree; and
replace the identified one or more concept phrases with a replacement token.

4. The non-transitory computer readable storage medium of claim 2, wherein the tokens in the target sentence are grouped using a recursive neural network comprising a layer of tree-LSTM (long short-term memory) node.

5. The non-transitory computer readable storage medium of claim 1, wherein the instructions for generating the probabilistic shift-reduce schedule for the generated parse tree cause the processor to:
create a pointer for traversing the parse tree, the pointer configured to create a new pointer in response to traversing the parse tree for at least one step.

6. The non-transitory computer readable storage medium of claim 5, wherein the new pointer is created based on a current state of a traversal of the parse tree.

7. The non-transitory computer readable storage medium of claim 5, wherein the probabilistic shift-reduce schedule is generated using at least a neural network layer, and wherein the pointer probabilistically determines to either execute a shift action or a reduce action on a token of the target sentence.

8. The non-transitory computer readable storage medium of claim 1, wherein the instructions when executed by the processor further cause the processor to:
extract semantic concepts from the identified one or more sentences by applying the plurality of weak learners, wherein the instructions to generate the code for verifying the condition specified in the target sentence cause the processor to:
retrieve a token from the parse tree;
determine an action by applying the probabilistic shift-reduce schedule; and in response to that the determined action is a reduce action:
determine whether the retrieved token from the parse tree is a replace token, and
in response to determining that the retrieved token from the parse tree is the replace token, replace the retrieved token from the parse tree with a semantic concept of the extracted semantic concepts extracted from the identified one or more sentences.

9. The non-transitory computer readable storage medium of claim 8, wherein the instructions for generating code for verifying the condition specified in the target sentence further cause the processor to:
in response to determining that the retrieved token from the parse tree is not the replace token, add the retrieved token from the parse tree to the generated code;
in response to determining that the action is a shift action:
retrieve a new token from the parse tree; and
determine a new action by applying the probabilistic shift-reduce schedule; and
m response to determining that the action is a terminate action, append a semicolon to the generated code.

10. A method comprising:
receiving a specification for a design of an electronic circuit;
parsing, by a processor, the specification to identify one or more sentences, each sentence of the identified one or more sentences specifying a condition to be satisfied for the design of the electronic circuit;
for each sentence of the one or more identified sentence, determining whether the sentence of each sentences of the identified one or more sentences is translatable by:
applying a plurality of weak learners, wherein each weak learner of the plurality of weak learners receives a set of tokens extracted from the sentence of each sentence of the identified one or more sentences and outputs a binary label; and
applying a binary classifier based on the binary labels for each of the plurality of weak learners; and
in response to determining that the sentence, as a target sentence, of each sentence of the identified one or more sentences is translatable, perform:
generating a parse tree for the target sentence;

generating a probabilistic shift-reduce schedule for the generated parse tree, wherein the probabilistic shift-reduce schedule includes a sequence of shift-reduce actions; and generating a code by parsing the target sentence using the generated probabilistic shift-reduce schedule for verifying that the condition specified in the target sentence is satisfied for the design of the electronic circuit.

11. The method of claim 10, wherein generating the parse tree for the target sentence comprises:
grouping tokens in the target sentence into one or more phrases that have a semantic meaning; and
encoding the grouped tokens in the target sentence into a syntactic parse tree.

12. The method of claim 11, wherein generating the parse tree for the target sentence further comprises:
identifying one or more concept phrases in the parse tree; and
replacing the identified one or more concept phrases with a replacement token.

13. The method of claim 10, wherein generating the probabilistic shift-reduce schedule for the generated parse tree comprises:
creating a pointer for traversing the parse tree, the pointer configured to create a new pointer in response to traversing the parse tree for at least one step.

14. The method of claim 13, wherein the new pointer is created based on a current state of a traversal of the parse tree.

15. The method of claim 13, wherein the probabilistic shift-reduce schedule is generated using at least a neural network layer, and wherein the pointer probabilistically determines to either execute a shift action or a reduce action on a token of the target sentence.

16. The method of claim 10, further comprising:
extracting semantic concepts from the identified one or more sentences by applying the plurality of weak learners,
wherein generating the code for verifying the condition specified in the target sentence comprises:
retrieving a token from the parse tree;
determining an action by applying the probabilistic shift-reduce schedule; and
in response to that the determined action is a reduce action:
determining whether the retrieved token from the parse tree is a replace token, and
in response to determining that the retrieved token from the parse tree is a replace token, replacing the retrieved token from the parse tree with a semantic concept of the extracted semantic concepts extracted from the identified one or more sentences.

17. The method of claim 16, wherein generating the code for verifying the condition specified in the target sentence further comprises:
in response to determining that the retrieved token from the parse tree is not the replace token, adding the retrieved token from the parse tree to the generated code;
in response to determining that the action is a shift action:
retrieving a new token from the parse tree;
determining a new action by applying the probabilistic shift-reduce schedule; and
in response to that the action is a terminate action, appending a semicolon to the generated code;
in response to determining that the action is a shift action:
retrieve a new token from the parse tree; and
determine a new action by applying the probabilistic shift-reduce schedule; and
in response to determining that the action is a terminate action, append a semicolon to the generated code.

18. A system comprising:
a memory storing instructions; and
a processor, coupled with the memory and to execute the instructions, the instructions when executed cause the processor to:
receive a specification for a design of an electronic circuit;
parse the specification to identify one or more phrases, each phrase of the identified one or more phrases specifying a condition to be satisfied for the design of the electronic circuit;
for each phrase of the one or more identified phrase, determine whether the phrase of each phrase of the identified one or more phrases is translatable by:
applying a plurality of weak learners, wherein each weak learner of the plurality of weak learners receives a set of tokens extracted from the phrase of each phrase of the identified one or more phrases and outputs a binary label; and
applying a binary classifier based on the binary labels for each of the plurality of weak learners; and
in response to determining that the phrase as a target phrase, of each phrase of the identified one or more phrases is translatable, perform;
generating a parse tree for the target phrase;
generating a probabilistic shift-reduce schedule for the generated parse tree, wherein the probabilistic shift-reduce schedule includes a sequence of shift-reduce actions; and
generating a code by parsing the phrase using the generated probabilistic shift-reduce schedule for verifying that the condition specified in the target phrase is satisfied for the design of the electric circuit.

19. The system of claim 18, wherein the instructions for generating the parse tree for the target sentence cause the processor to:
group tokens in the target sentence into one or more phrases that have a semantic meaning; and
encode the grouped tokens in the target sentence into a syntactic parse tree.

20. The system of claim 19, wherein the instructions for generating the parse tree for the target sentence further cause the processor to:
identify one or more concept phrases in the parse tree; and
replace the identified one or more concept phrases with a replacement token.

* * * * *